(12) United States Patent
Chowdhuri et al.

(10) Patent No.: US 6,541,300 B1
(45) Date of Patent: Apr. 1, 2003

(54) SEMICONDUCTOR FILM AND PROCESS FOR ITS PREPARATION

(75) Inventors: Abhijit R. Chowdhuri, Oak Park, IL (US); Jie Zhang, Buffalo Grove, IL (US); Daniel R. Gamota, Palatine, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/058,704

(22) Filed: Jan. 28, 2002

(51) Int. Cl.$^7$ ............................................... H01L 51/40
(52) U.S. Cl. ............................................. 438/99; 257/40
(58) Field of Search ............................... 438/99; 257/40

(56) References Cited

U.S. PATENT DOCUMENTS 6,114,088 A * 9/2000 Wolk et al. ............... 430/273.1
6,194,119 B1 * 2/2001 Wolk et al. ................. 430/200

* cited by examiner

Primary Examiner—Trung Dang
(74) Attorney, Agent, or Firm—Fitch, Even, Tabin & Flannery

(57) ABSTRACT

The present invention is directed to semiconductor films and a process for their preparation. In accordance with the process of the present invention, semiconductor organic material is blended with a multi-component solvent blend and the blend is deposited on a receiving material to provide a continuous highly ordered film having greater periodicity than films produced with a single solvent/semiconducting material blend under similar processing conditions.

49 Claims, 1 Drawing Sheet

SEMICONDUCTOR FILM AND PROCESS FOR ITS PREPARATION

The present invention relates to semiconductor films and a process for their formation. More particularly, semiconductor organic material is blended with a multi-component solvent blend having a combined polarity within a defined range. The blend of semiconductor organic material and multi-component solvent blend is effective for providing a highly ordered semiconductor film having an improved mobility and for providing a device having improved on/off ratio characteristics.

BACKGROUND

Thin films of organic semiconductor material are used in the production of organic field effect transistors (OFET). The performance of OFETs is measured by parameters such as mobility and depends in part upon the molecular orientation of the semiconductor film. Factors such as interfacial structure, the degree of molecular order and orientation of the thin film affect film properties.

Ordering of the semiconductor film depends in turn on how the thin film is deposited. It is generally believed that increasing the amount of molecular order, for example by reducing the grain boundary resistance, or improving long-range molecular order, permits charge carriers such as electrons or holes to more efficiently move. This can increase the mobility properties of the film.

Deposition techniques that provide inexpensive films of a desired uniformity and thickness do not necessarily provide practical, efficient production techniques or provide semiconducting films that exhibit the requisite mobility and other necessary functional characteristics for thin film transistors. For example, a solvent cast film that is permitted to dry slowly often exhibits a relatively high mobility when incorporated into an OFET. Unfortunately, some deposition techniques that contemplate fast and efficient manufacturing do not readily permit slow evaporation of solvent. For example, though spin coating can yield relatively uniform thin wet films, the solvent usually leaves the film relatively quickly, generally leading to a low degree of molecular order.

Costly processes are required to create highly ordered organic semiconductor films. The effectiveness of organic polymer semiconductor films as active layers in organic film transistors (OFET) depends on the ability of such films to form highly ordered self-assembled layers. These polymers have low solubility in common solvents and dissolve, to a useful extent, in solvents that fall within a narrow range of solvent polarity. This narrows the process window for OFET manufacturing. In addition, the rapid loss of solvent during film formation drives the process away from its thermodynamic equilibrium resulting in poor film structure (e.g. short $\pi$-conjugation length).

In the past, solvents with low polarity were used for the preparation of active layers in OFETs. These solvents evaporated very rapidly during the film formation process due to their high vapor pressure. During the film-forming process, gelation started at the early stages when the solvent began to evaporate. If the solvent had a very high vapor pressure at the process temperature, the final film quality was determined by the morphology and chain conformation present at the very early stage of the process. Such structures have very short $\pi$-conjugation length, which in turn lowers the mobility and affects the overall performance of such films in OFET applications.

DESCRIPTION OF THE INVENTION

Figure 1:
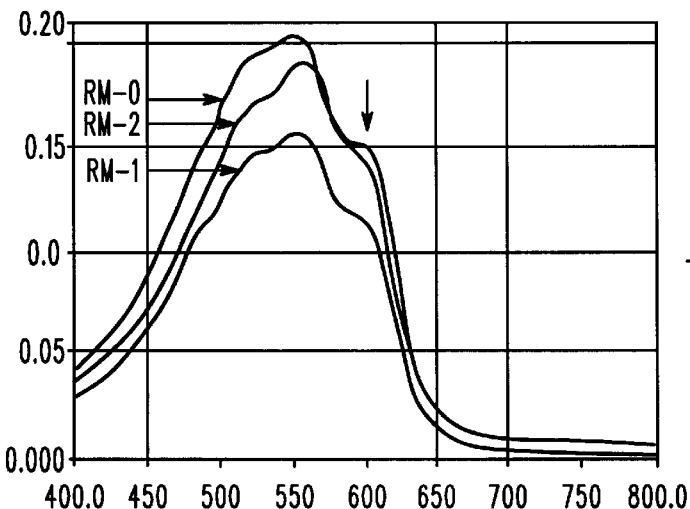
FIG. 1 shows a UV-VIS spectra of different poly(3-hexylthiophene-2,5-diyl) films (P3HT); Film 1 is P3HT in chloroform; Film 2 is P3HT in chloroform and toluene; Film 3 is P3HT in toluene. The figure shows that the film formed using the binary solvent system has more local order.

The present invention is directed to semiconductor films and a process for their preparation. The method of the present invention provides a semiconducting organic material/multi-component solvent blend which can be deposited on a receiving substrate using standard application techniques to provide a semiconducting film with enhanced semiconducting parameters. The semiconducting organic material/multi-component solvent blend that is applied to a receiving substrate is effective for providing a highly ordered semiconducting film having a mobility of at least about $10^{-3}$ $cm^2/V$-s and is effective for providing a device having an on/off ratio of greater than about 1000, each of which values are greater for the same semiconducting material if such material were applied under the same conditions with one solvent.

In accordance with the process of the invention, semiconductor organic material is blended with a multi-component solvent blend which is a mixture of at least two components to provide a solution or dispersion of the material in the solvent mixture. In an important aspect of the invention, the mixture is a blend of two solvents or is a blend of water and at least two solvents and possibly yet another component dispersible in the blend. The blend of semiconductor organic material and multi-component solvent blend is deposited on a receiving material to provide a continuous highly ordered film having greater periodicity than films produced with a single solvent/semiconducting material blend under similar processing conditions. Surprisingly, the film of the present invention has better performance characteristics over films produced using the single solvent as aforesaid at the same processing conditions. The film and device that includes the film of the present invention have improvements in mobility and an on/off ratio of at least about 20% and up to about 100,000% over films produced using a single solvent depositing the same semiconducting organic material at the same thickness at the same processing conditions.

In an important aspect of the invention, the semiconducting organic material includes at least one conjugated oligomer, polymer or a co-polymer that contains segments of $\pi$-conjugated moieties or other semiconducting unsaturated organic material. The semiconductor organic material is blended with a multi-component solvent blend where the semiconducting organic material and solvent are in a weight to volume ratio which is effective for providing a semiconductor film and device having an improved performance in mobility and/or an on/off ratio as compared to a semiconductor film and device formed using only one solvent of the blend in the same amount as which is in the blend under the same process conditions. Generally, the semiconducting organic material weight to multi-component solvent blend volume ratio is from about 0.025 weight to volume percent to about 60.0 weight to volume percent. Examples of semiconductor organic materials effective for use in the present invention include polythiophenes, oligothiophenes, alkyl-substituted anthradithiophenes, alkyl-substituted napthadithiophenes, fused-ring tetracarboxylic diimide, anthracene 2,3,6,7-tetracarboxylic acid diimides, polyaniline, poly(phenylene-vinylene), poly(thienylene-vinylene), pentacene, pthalocyanine coordination compounds, and mixtures thereof.

The solvents in the multi-component solvent blend are selected to provide an effective combined polarity ($\phi_m$) of at from about 0.1 to about 1.0. A mixture of components having a combined polarity within this range is effective for providing films which are more highly ordered and which have a greater periodicity as compared to films produced with a single solvent. Examples of solvents useful in the present invention include but are not limited to xylene, benzene, toluene, acetone, 2-butanone, methanol, ethanol, 1-propanol, 2-propanol, 1-butanol, t-butanol, methylene chloride, chloroform, carbontetrachloride, water, and tetrahydrofuran.

The blend of semiconductor organic material and multi-component solvent blend provides a semiconductor organic material/multi-component solvent blend that may be applied to a receiving material to form a semiconductor film. The semiconductor organic material/multi-component solvent blend is applied to a receiving material, such as a rigid or flexible substrate, using methods commonly known in the art, such as spin-coating, microcontact printing, off-set printing, screen printing, flexographic printing, dipping, jetting, or dispensing. After depositing the semiconductor organic material/multi-component solvent blend on the receiving substrate, solvent is removed. In an important aspect, the process of the invention does not require specific temperature control or control of rates of temperature change. In this aspect of the invention, the process may be conducted at a temperature between about 10° C. to about 100° C. and still provide optimal film properties.

In an important aspect of the invention, the semiconductor organic materials are regioregular polymers. Regioregular polymers are polymers that include substitutions in the polymer backbone that are effective for providing steriochemical rigidity that prevents that polymer from folding or coiling. Examples of regioregular polymers include poly(3-alkylthiophene)and substituted polyaniline.

Definitions

"Mobility" is the measure of average carrier drift velocity in the film when subjected to an electric field.

"On/off" ratio means the value calculated when taking the ratio of the source-drain current when the transistor is "on" to the source-drain current when the transistor is "off".

"Semiconducting organic material" means an organic material when deposited on a substrate provides a mobility in excess of about $10^{-3}$ cm$^2$/V-s and which is effective for providing a device having an on/off ratio of greater than about 1000.

"Dispersion" means that the composition must include a liquid and particles in the liquid which are detectable by light scattering.

"Dissolved" in respect to a semiconductor organic material/solvent blend means that the material which is dissolved does not exist in a liquid in particulate form where particles larger than single molecules are etectable by light scattering.

"Soluble" means a liquid or solid that can be partially or fully dissolved in a liquid.

"Receiving material" or "substrate" means but is not limited to either a material that forms the conductor, dielectric, or active layer.

"π-conjugation" means the delocalization of electrons over a molecular backbone, e.g. systems consisting of alternating C—C and C=C show extensive π-conjugation.

Semiconductor Organic Materials

Examples of semiconductor organic materials effective for use in the present invention include polythiophenes such as poly(3-alkylthiophene), poly(3-hexylthiophene), poly(3-dodecylthiophene), poly(3-alkylthiophene-2,5-diyl), oligothiophenes such as sexithiophene, alkyl-substituted anthradithiophenes such as 2,8-dihexylanthradithiophene, 2,8-dioctadecylanthradithiophene, alkyl-substituted napthadithiophenes such as 2,8-dihexylnapthadithiophene, 2,8-dioctadecylnapthadithiophene, fused-ring etracarboxylic diimide such as naphthalene 1,4,5,8-tetracarboxylic acid diimides, anthracene 2,3,6,7-tetracarboxylic acid diimides, polyaniline, poly(phenylene-vinylene), poly(thienylene-vinylene), pentacene, and pthalocyanine coordination compounds where the coordinate ion can be but is not limited to platinum (Pt), copper (Cu), zinc (Zn), nickel (Ni), tin (Sn), iron (Fe), or hydrogen (H2). As used herein, alkyl refers to a $C_1$ to $C_4$ alkyl and alkoxy refers to a $C_1$ to $C_4$ alkoxy.

In one aspect of the invention, the semiconductor organic material may be modified by grafting of alkyl and/or alkoxyalkyl side chains in an amount effective for enhancing the uniform dispersion of the semiconductor organic materials in a solvent mixture. Uniform dispersion or uniformly dispersed means that the semiconductor organic material is a solution or dispersion where the material is nearly dissolved in a mixture of solvents, or the semiconductor organic material forms a suspension in the mixture of solvents. Those skilled in the art can identify chemistry modification routes, e.g. grafting of alkyl or alkoxyalkyl chains onto the semiconductor organic materials that enable semiconductor organic material to be uniformly dispersed in a carrier.

Solvents and Other Components

The multi-component solvent blend of the present invention is formulated based on relative solvent and component polarities and vapor pressures under a given set of process conditions. In accordance with the invention, solvents and other components may be selected based on the following conditions $$\sum_{i=1}^{n} \phi_i \chi_i = \phi_m \quad 0.1 \leq \phi_m \leq 1.0$$

where $\phi_i$ and $\chi_i$ are the relative solvent polarity and mole fraction of the i th components respectively. The range of values for $\phi_m$ depends on the chemical structure of the semiconductor organic material. The choice of solvent and other components is also dependent on the vapor pressure and rheological properties required for a given manufacturing process and processing conditions.

In an important aspect of the invention, the multi-component solvent blend may be a blend of at least two organic solvents. Alternatively, the multi-component blend may include a mixture of one or more organic solvents and/or water, and an inorganic compound as described below.

Some examples of solvents effective for use in the present invention are set forth below.

| Solvents | Relative Solvent Polarity |
|---|---|
| Xylene | 0.074 |
| Benzene | 0.111 |
| Toluene | 0.099 |
| Acetone | 0.355 |
| 2-butanone | 0.327 |
| Methanol | 0.762 |
| Ethanol | 0.654 |
| 1-propanol | 0.617 |
| 2-propanol | 0.546 |
| 1-butanol | 0.602 |
| t-butanol | 0.389 |
| Methylene chloride (Dichloromethane) | 0.309 |
| Chloroform | 0.295 |
| Carbontetrachloride | 0.052 |
| Tetrahydrofuran | 0.207 |

Some examples of inorganic compounds which may serve as components in the multi-component solvent blend include sodium chloride, sodium nitrate, water, potassium borate, sodium borate, sodium fluorosilicate, magnesium fluorosilicate, ammonium fluorosilicate, calcium hypochlorite, and calcium carbide.

Process for Forming Organic Semiconductor Films

A film of the organic semiconductor material (sometimes referred to as active semiconductor layer) is formed by applying the solution composed of the semiconducting organic material uniformly dispersed in a solvent mixture to the receiving structure. It is important that the semiconducting material be uniformly dispersed to minimize the potential for film discontinuities. A conventional solution processing technique as known in the art such as spin-coating, microcontact printing, off-set printing, screen printing, flexographic printing, dipping, jetting, or dispensing is used to deposit a volume of solution that will yield a processed film of less than about 100 microns in thickness. The thickness is selected so that a uniform film is created having neither gaps nor holes. After depositing the solution, the solution is subjected to a process that removes the solvent mixture at a rate effective for providing a film having a structure yielding optimal semiconductor properties e.g., high mobility. The structure can be subjected to a subsequent thermal schedule to enhance the film bulk structural properties. A thermal schedule is identified based on the semiconducting organic material/solvent blend.

Film Bulk Structure

The deposited film formed by the method of the invention has long-range structural order and periodicity that enables unhindered movement of the carriers (electron or hole). The deposited film has a mobility in excess of about $10^{-3}$ cm$^2$/V-s and is effective for providing a device having an on/off ratio of greater than about 1000. In one aspect of the invention, the deposited film and device includes the film having an improvement in mobility and on/off ratio of about 20% over a film produced using a single solvent system at the same processing conditions, in another aspect has an improvement of about 50%, in another aspect an improvement of about 80%, in another aspect an improvement of about 100%, and in another aspect an improvement of about 100,000%.

The deposited semiconductor organic film must be in physical contact with at least two of the contacts that are spaced-apart and must span the entire length of this spacing to create a path for carrier movement through at least a portion of the semiconductor film. The film should be substantially without gaps or holes that negatively affect the transport properties of the semiconducting material.

The following examples illustrate methods for carrying out the invention and should be understood to be illustrative of, but not limiting upon, the scope of the invention which is defined in the appended claims.

EXAMPLES

Example 1

Binary Solvent System

A binary mixture (1:5) comprised of 0.5 mg regioregular poly(3-hexylthiophene-2,5-diyl) was dissolved in 3 ml chloroform at a temperature of from 40–65° C. The resulting solution was diluted with 15 ml toluene and cooled down to a temperature of 25° C. The $\phi_m$ for this system was 0.125. This solution was found to be stable and did not precipitate any solute during processing. When this solution was used to form a semiconducting film by solvent evaporation, the evaporation rate was such that it allowed the formation of a coherent, continuous film without any defects. The film formed from the n-component solvent system was found to have better electrical characteristics when compared to films formed from a single solvent system (chloroform).

Figure 2:
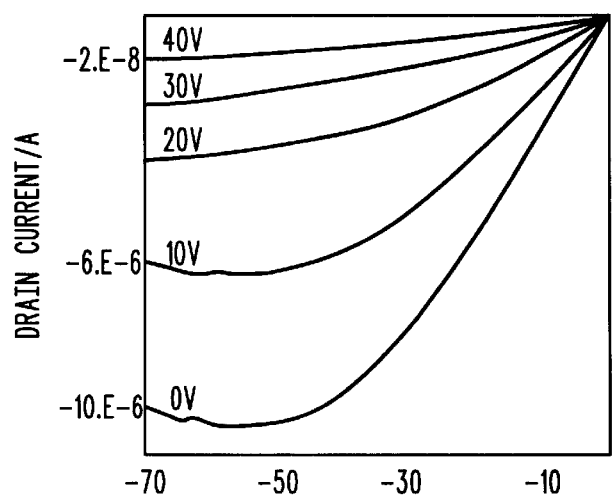
FIG. 2 illustrates measured output characteristics of a regioregular poly(3-hexylthiophene-2,5-diyl) OFET formed from a binary solvent formulation. Applied gate voltages are shown inside the plot. The figure shows that the fabricated OFET device demonstrates field effect behavior as gate voltage is varied.

In FIG. 1, film 2 shows a red shift of ~10 nm with pronounced vibronic fine structures (shoulder around 600 nm) indicating improved local order in the film. FIG. 2 is an I-V curve of the fabricated device using the film of the present invention. The device mobility was ~0.013 cm$^2$/V s which was more than an order of magnitude higher when compared to devices fabricated using a single solvent system.

Example 2

Ternary Solvent System

Figure 3:
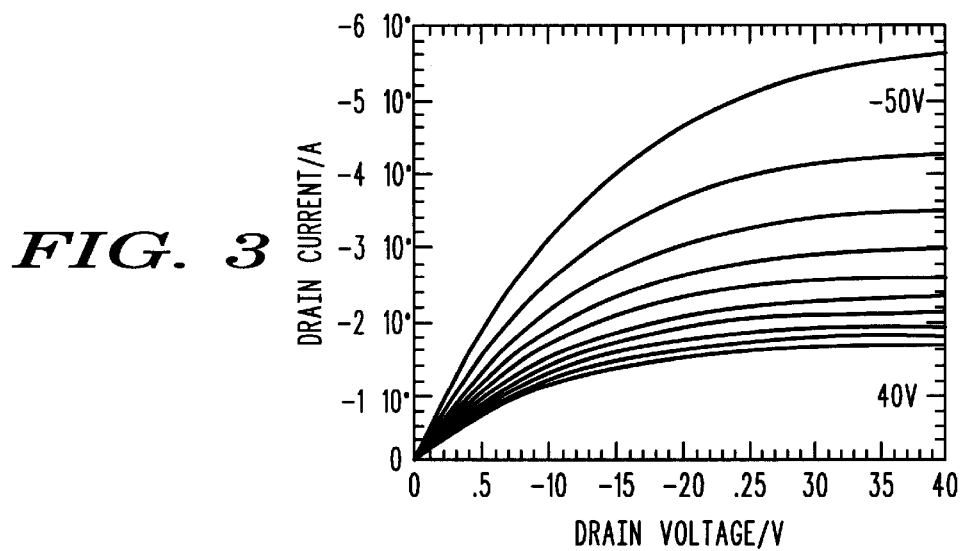
FIG. 3 illustrates measured output characteristics of a regioregular poly(3-hexylthiophene-2,5-diyl) OFET formed from a ternary solvent formulation. The figure shows that the OFET demonstrates modulation.

A ternary solvent 1:1:4 mixture of chloroform, tetrahydrofuran (THF) and p-xylene was used to dissolve poly(3-hexylthiophene-2,5-diyl) to form a solution. The $\phi_m$ for this ternary solvent system was 0.126. The film was found to have better local order when compared to films formed by using a single solvent system. I-V characteristics obtained by using this system are shown in FIG. 3. The saturation regime starts at lower gate voltages when compared to transistors formed from single solvent systems.

Numerous modifications and variations in practice of the invention are expected to occur to those skilled in the art upon consideration of the foregoing detailed description of the invention. Consequently, such modifications and variations are intended to be included within the scope of the following claims.

What is claimed is:

1. A process for production of a semiconductor film, the process comprising:

blending a semiconductor organic material with a multi-component solvent blend; and applying the semiconductor organic material multi-component solvent blend to a receiving material to form a semiconductor film, the semiconductor film having a higher mobility than a semiconductor film produced using only one solvent of the multi-component solvent blend, the semiconductor film effective for providing a device having a higher on/off ratio than a device that includes a semiconductor film produced using only one solvent of the multi-component solvent blend.

2. The process for production of a semiconductor film according to claim 1 wherein the semiconductor film has a mobility of at least about $10^{-3}$ cm$^2$/V-s and the device has an on/off ratio of greater than about 1000.

3. The process for production of a semiconductor film according to claim 1 wherein from about 0.025 weight to volume percent to about 60 weight to volume percent semiconductor organic material is blended with the multi-component solvent blend.

4. The process for production of a semiconductor film according to claim 1 wherein the multi-component solvent blend has an effective combined polarity of from about 0.1 to about 1.0.

5. The process for production of a semiconductor film according to claim 1 wherein the semiconductor organic material is selected from the group consisting of polythiophenes, oligothiophenes, alkyl-substituted anthradithiophenes, alkyl-substituted napthadithiophenes, fused-ring tetracarboxylic diimide, anthracene 2,3,6,7-tetracarboxylic acid diimides, polyaniline, poly(phenylene-vinylene), poly(thienylene-vinylene), pentacene, pthalocyanine coordination compounds, and mixtures thereof.

6. The process for production of a semiconductor film according to claim 1 wherein the multi-component solvent blend includes a solvent selected from the group consisting of xylene, benzene, toluene, acetone, 2-butanone, methanol, ethanol, 1-propanol, 2-propanol, 1-butanol, t-butanol, methylene chloride, chloroform, carbontetrachloride, water, tetrahydrofuran, and mixtures thereof.

7. The process for production of a semiconductor film according to claim 1 wherein the semiconductor organic material is regioregular poly(3-hexylthiophene-2,5-diyl) and the multi-component solvent blend includes chloroform and toluene.

8. The process for production of a semiconductor film according to claim 1 wherein the semiconductor organic material is regioregular poly(3-hexylthiophene-2,5-diyl) and the multi-component solvent blend includes chloroform, tetrahydrofuran and xylene.

9. The process for production of a semiconductor film according to claim 1 wherein the multi-component solvent blend include a compound selected from the group consisting of sodium chloride, sodium nitrate, potassium borate, sodium borate, sodium fluorosilicate, calcium hypochlorite, calcium carbide, and mixtures thereof.

10. A process for production of a semiconductor film, the process comprising:

blending a semiconductor organic material with a multi-component solvent blend; and applying the semiconductor organic material multi-component solvent blend to a receiving material to form a semiconductor film, the semiconductor film having a mobility of at least about $10^{-3}$ cm$^2$/V-s and the semiconductor film being effective for providing a device with an on/off ratio of greater than about 1000.

11. The process for production of a semiconductor film according to claim 10 wherein from about 0.025 weight to volume percent to about 60 weight to volume percent semiconductor organic material is blended with the multi-component solvent blend.

12. The process for production of a semiconductor film according to claim 10 wherein the multi-component solvent blend has a combined polarity of from about 0.1 to about 1.0.

13. The process for production of a semiconductor film according to claim 10 wherein the semiconductor organic material is selected from the group consisting of polythiophenes, oligothiophenes, alkyl-substituted anthradithiophenes, alkyl-substituted napthadithiophenes, fused-ring tetracarboxylic diimide, anthracene 2,3,6,7-tetracarboxylic acid diimides, polyaniline, poly(phenylene-vinylene), poly(thienylene-vinylene), pentacene, pthalocyanine coordination compounds, and mixtures thereof.

14. The process for production of a semiconductor film according to claim 10 wherein the multi-component solvent blend includes a solvent selected from the group consisting of xylene, benzene, toluene, acetone, 2-butanone, methanol, ethanol, 1-propanol, 2-propanol, 1-butanol, t-butanol, methylene chloride, chloroform, carbontetrachloride, water, tetrahydrofuran, and mixtures thereof.

15. The process for production of a semiconductor film according to claim 10 wherein the semiconductor organic material is regioregular poly(3-hexylthiophene-2,5-diyl) and the multi-component solvent blend includes chloroform and toluene.

16. The process for production of a semiconductor film according to claim 10 wherein the semiconductor organic material is regioregular poly(3-hexylthiophene-2,5-diyl) and the multi-component solvent blend includes chloroform, tetrahydrofuran and xylene.

17. The process for production of a semiconductor film according to claim 10 wherein the multi-component solvent blend include a compound selected from the group consisting of sodium chloride, sodium nitrate, potassium borate, sodium borate, sodium fluorosilicate, calcium hypochlorite, calcium carbide, and mixtures thereof.

18. A process for production of a semiconductor film, the process comprising blending a semiconductor organic material with a multi-component solvent blend having a combined polarity of from about 0.1 to about 1.0 to form a semiconductor organic material/multi-component solvent blend; and applying the semiconductor organic material/multi-component solvent blend to a receiving material to form a semiconductor film.

19. The process for production of a semiconductor film according to claim 18 wherein the semiconductor organic material/solvent blend includes from about 0.025 weight to volume percent to about 60 weight to volume percent semiconductor organic material and multi-component solvent blend.

20. The process for production of a semiconductor film according to claim 18 wherein the semiconductor film has a mobility of at least about $10^{-3}$ cm$^2$/V-s and the semiconductor film is effective for providing a device having an on/off ratio of greater than about 1000.

21. The process for production of a semiconductor film according to claim 18 wherein the semiconductor organic material is selected from the group consisting of polythiophenes, oligothiophenes, alkyl-substituted anthradithiophenes, alkyl-substituted napthadithiophenes, fused-ring tetracarboxylic diimide, anthracene 2,3,6,7-tetracarboxylic acid diimides, polyaniline, poly(phenylene-vinylene), poly(thienylene-vinylene), pentacene, pthalocyanine coordination compounds, and mixtures thereof.

22. The process for production of a semiconductor film according to claim 18 wherein the multi-component solvent blend includes a solvent selected from the group consisting of xylene, benzene, toluene, acetone, 2-butanone, methanol, ethanol, 1-propanol, 2-propanol, 1-butanol, t-butanol, methylene chloride, chloroform, carbontetrachloride, water, tetrahydrofuran, and mixtures thereof.

23. The process for production of a semiconductor film according to claim 18 wherein the semiconductor organic material is regioregular poly(3-hexylthiophene-2,5-diyl) and the multi-component solvent blend includes chloroform and toluene.

24. The process for production of a semiconductor film according to claim 18 wherein the semiconductor organic material is regioregular poly(3-hexylthiophene-2,5-diyl) and the multi-component solvent blend includes chloroform, tetrahydrofuran and xylene.

25. The process for production of a semiconductor film according to claim 18 wherein the multi-component solvent blend include a compound selected from the group consisting of sodium chloride, sodium nitrate, potassium borate, sodium borate, sodium fluorosilicate, calcium hypochlorite, calcium carbide, and mixtures thereof.

26. A process for production of a semiconductor film, the process comprising:
blending from about 0.025 weight to volume percent to about 60 weight to volume percent semiconductor organic material with a multi-component solvent blend having a combined effective polarity of from about 0.1 to about 1.0; and
applying the semiconductor organic material multi-component solvent blend to a receiving material to form a semiconductor film,
the semiconductor film having a mobility of at least about $10^{-3}$ cm$^2$/V-s and the semiconductor film being effective for providing a device having an on/off ratio of greater than about 1000.

27. The process for production of a semiconductor film according to claim 26 wherein the semiconductor organic material is selected from the group consisting of polythiophenes, oligothiophenes, alkyl-substituted anthradithiophenes, alkyl-substituted napthadithiophenes, fused-ring tetracarboxylic diimide, anthracene 2,3,6,7-tetracarboxylic acid diimides, polyaniline, poly(phenylene-vinylene), poly(thienylene-vinylene), pentacene, pthalocyanine coordination compounds, and mixtures thereof.

28. The process for production of a semiconductor film according to claim 26 wherein the multi-component solvent blend includes a solvent selected from the group consisting of xylene, benzene, toluene, acetone, 2-butanone, methanol, ethanol, 1-propanol, 2-propanol, 1-butanol, t-butanol, methylene chloride, chloroform, carbontetrachloride, water, tetrahydrofuran, and mixtures thereof.

29. The process for production of a semiconductor film according to claim 26 wherein the semiconductor organic material is regioregular poly(3-hexylthiophene-2,5-diyl) and the multi-component solvent blend includes chloroform and toluene.

30. The process for production of a semiconductor film according to claim 26 wherein the semiconductor organic material is regioregular poly(3-hexylthiophene-2,5-diyl) and the multi-component solvent blend includes chloroform, tetrahydrofuran and xylene.

31. The process for production of a semiconductor film according to claim 26 wherein the multi-component solvent blend include a compound selected from the group consisting of sodium chloride, sodium nitrate, potassium borate, sodium borate, sodium fluorosilicate, calcium hypochlorite, calcium carbide, and mixtures thereof.

32. A semiconductor organic material/multi-component solvent blend comprising semiconductor organic material and a multi-component solvent blend, the semiconductor organic material/multi-component solvent blend being effective for providing a semiconductor film having a mobility of at least about $10^{-3}$ cm$^2$/V-s and effective for providing a device having an on/off ratio of greater than about 1000.

33. The blend according to claim 32 wherein from about 0.025 weight to volume percent to about 60 weight to volume percent semiconductor organic material is blended with a multi-component solvent blend.

34. The blend according to claim 32 wherein the multi-component solvent blend has an effective combined polarity of from about 0.1 to about 1.0.

35. The blend according to claim 32 wherein the semiconductor organic material is selected from the group consisting of polythiophenes, oligothiophenes, alkyl-substituted anthradithiophenes, alkyl-substituted napthadithiophenes, fused-ring tetracarboxylic diimide, anthracene 2,3,6,7-tetracarboxylic acid diimides, polyaniline, poly(phenylene-vinylene), poly(thienylene-vinylene), pentacene, pthalocyanine coordination compounds, and mixtures thereof.

36. The blend according to claim 32 wherein the multi-component solvent blend includes a solvent selected from the group consisting of xylene, benzene, toluene, acetone, 2-butanone, methanol, ethanol, 1-propanol, 2-propanol, 1-butanol, t-butanol, methylene chloride, chloroform, carbontetrachloride, water, tetrahydrofuran, and mixtures thereof.

37. The blend according to claim 32 wherein the semiconductor organic material is regioregular poly(3-hexylthiophene-2,5-diyl) and the multi-component solvent blend includes chloroform and toluene.

38. The blend according to claim 32 wherein the semiconductor organic material is regioregular poly(3-hexylthiophene-2,5-diyl) and the multi-component solvent blend includes chloroform, tetrahydrofuran and xylene.

39. The blend according to claim 32 wherein the multi-component solvent blend include a compound selected from the group consisting of sodium chloride, sodium nitrate, potassium borate, sodium borate, sodium fluorosilicate, calcium hypochlorite, calcium carbide, and mixtures thereof.

40. A semiconductor film having a mobility of at least about $10^{-3}$ cm$^2$/V-s and effective for providing a device having an on/off ratio of greater than about 1000, the semiconductor film formed by a process comprising:
blending a semiconductor organic material with a multi-component solvent blend; and
applying the semiconductor organic material multi-component solvent blend to a receiving material to form a semiconductor film having a mobility at least about 20% greater than a film of the same semiconductor material formed with one solvent under the same processing conditions, the semiconductor film effective for providing a device having an on/off ratio of about 20% greater than a device that includes a film of the same semiconductor material formed with one solvent under the same processing conditions.

41. The semiconductor film according to claim 40 wherein from about 0.025 weight to volume percent to about 60 weight to volume percent semiconductor organic material is blended with a multi-component solvent blend.

42. The semiconductor film according to claim 40 wherein the multi-component solvent blend has an effective combined polarity of from about 0.1 to about 1.0.

43. The semiconductor film according to claim 40 wherein the semiconductor organic material is selected from the group consisting of polythiophenes, oligothiophenes, alkyl-substituted anthradithiophenes, alkyl-substituted napthadithiophenes, fused-ring tetracarboxylic diimide, anthracene 2,3,6,7-tetracarboxylic acid diimides, polyaniline, poly(phenylene-vinylene), poly(thienylene-vinylene), pentacene, pthalocyanine coordination compounds, and mixtures thereof.

44. The semiconductor film according to claim 40 wherein the multi-component solvent blend includes a solvent selected from the group consisting of xylene, benzene, toluene, acetone, 2-butanone, methanol, ethanol, 1-propanol, 2-propanol, 1-butanol, t-butanol, methylene chloride, chloroform, carbontetrachloride, water, tetrahydrofuran, and mixtures thereof.

45. The semiconductor film according to claim 40 wherein the semiconductor organic material is regioregular poly(3-hexylthiophene-2,5-diyl) and the multi-component solvent blend includes chloroform and toluene.

46. The semiconductor film according to claim 40 wherein the semiconductor organic material is regioregular poly(3-hexylthiophene-2,5-diyl) and the multi-component solvent blend includes chloroform, tetrahydrofuran and xylene.

47. The semiconductor film according to claim 40 wherein the multi-component solvent blend include a compound selected from the group consisting of sodium chloride, sodium nitrate, potassium borate, sodium borate, sodium fluorosilicate, calcium hypochlorite, calcium carbide, and mixtures thereof.

48. A semiconductor film comprising a semiconductor organic material, the semiconductor film having a mobility of at least about $10^{-3}$ cm$^2$/V-s, the semiconductor film having a mobility at least about 20% greater than a film of the same semiconductor material formed with one solvent under the same processing conditions.

49. The semiconductor film according to claim 48 wherein the semiconductor organic material is selected from the group consisting of polythiophenes, oligothiophenes, alkyl-substituted anthradithiophenes, alkyl-substituted napthadithiophenes, fused-ring tetracarboxylic diimide, anthracene 2,3,6,7-tetracarboxylic acid diimides, polyaniline, poly(phenylene-vinylene), poly(thienylene-vinylene), pentacene, pthalocyanine coordination compounds, and mixtures thereof.

* * * * *

UNITED STATES PATENT AND TRADEMARK OFFICE
CERTIFICATE OF CORRECTION

PATENT NO.     : 6,541,300 B1
DATED          : April 1, 2003
INVENTOR(S)    : Chowdhuri et al.

It is certified that error appears in the above-identified patent and that said Letters Patent is hereby corrected as shown below:

<u>Column 1,</u>
Line 3, after the title, insert the following new paragraph:

-- This invention was made with United States Government support under Agreement No. 70NANB0H3033 awarded by the National Institute of Standards and Technology (NIST). The United States Government has certain rights in the invention. --

Signed and Sealed this

Sixteenth Day of September, 2003

JAMES E. ROGAN
*Director of the United States Patent and Trademark Office*